United States Patent [19]
Heid

[11] Patent Number: 5,662,112
[45] Date of Patent: Sep. 2, 1997

[54] METHOD FOR TIME- AND LOCATION-RESOLVED DISPLAY OF FUNCTIONAL BRAIN ACTIVITIES OF A PATIENT

[75] Inventor: Oliver Heid, Bern, Germany

[73] Assignee: Siemens Aktiengesellschaft, Munich, Germany

[21] Appl. No.: 694,748

[22] Filed: Aug. 9, 1996

[30] Foreign Application Priority Data

Aug. 11, 1995 [DE] Germany .................. 195 29 639.7

[51] Int. Cl.$^6$ ........................................... A61B 5/055
[52] U.S. Cl. .................. 128/653.2; 128/731; 324/309
[58] Field of Search .................. 128/653.1, 653.2, 128/731, 732, 901; 324/309

[56] References Cited

U.S. PATENT DOCUMENTS 5,477,144 12/1995 Rogers ........................... 324/309
5,526,813 6/1996 Yoshida ........................ 128/653.2
5,565,777 10/1996 Kanayama et al. .................. 324/309

OTHER PUBLICATIONS

"Temporal and Spatial Resolution. Concepts, Sequences, and Applications," Frahm et al., SMRM/SMRI Workshop, Functional Imaging of the Brain, Jun. 17–19, 1993, pp. 153–161.

*Primary Examiner*—Marvin M. Lateef
*Assistant Examiner*—Eleni Mantis Mercader
*Attorney, Agent, or Firm*—Hill, Steadman & Simpson

[57] ABSTRACT

Physiological processes are stimulated in a patient by a stimulation function f (t). The stimulation function f (t) is non-periodic and has as few secondary maxima as possible in its autocorrelation function. A pulse sequence for the excitation in, and read out of nuclear magnetic resonance signals from the patient to obtain, time- and location-resolved nuclear magnetic resonance signals, which are converted into image data. A chronological cross-correlation of the data obtained in this way with the stimulation function f(t) is undertaken, and time- and location-resolved activity changes in the patient are thereby detected.

7 Claims, 3 Drawing Sheets

RF

SS

PC

RO

S

METHOD FOR TIME- AND LOCATION-RESOLVED DISPLAY OF FUNCTIONAL BRAIN ACTIVITIES OF A PATIENT

BACKGROUND OF THE INVENTION

1. Field of the Invention

The present invention is directed to a method for time- and location-resolved representation of functional brain activities of a patient, as well as to an arrangement for carrying out the method.

2. Description of the Prior Art

It has been determined that brain activities in the cerebral cortex, caused by stimulation, can be detected by nuclear magnetic resonance tomography. Stimulation experiments of this type have been carried out e.g. with visual stimulation and with stimulation around the primary motor cortex by means of finger movement. Functional brain investigations can also be carried out using other techniques, e.g. PET (positron emission technology) or EEG, however, a considerably better spatial resolution can be achieved by means of nuclear spin tomography.

With real-time data recording, the time resolution is also limited in nuclear magnetic resonance technology due to the limited recording speed, therefore proposals have been made for triggering data acquisition for functional imaging by means of stimulation. For this purpose only a part of the raw data required for a complete image data set is obtained per stimulation. It has been proposed by J. Frahm et al., in SMRM/SMRI Workshop: Functional Imaging of the Brain, Arlington, Jun. 17–19, 1993, to synchronize the data acquisition by periodic repetition of a task that triggers brain activities. A comparable method has already been employed for cine recording of heart movements (see e.g. Dennis Atkinson et al., "Cineangiography of the Heart in a Single Breath Hold with a Segmented TurboFLASH Sequence," in Radiology, 1991, 178, pp. 357–360).

One problem of functional imaging is the Separation of signal changes caused by stimulations, by brain activities, from other signal changes, e.g. caused by movements. In the article by P. A. Bandettini et al., "Processing Strategies for Time-Course Data Sets in Functional MRI of the Human Brain," Magnetic Resonance in Medicine, 30, pp. 161–173 (1993), it was proposed among other things for the solution of this problem to calculate for each pixel a correlation coefficient between the stimulation function and the obtained chronological signal curve. As a stimulation function, periodically repeated stimulations separated by pauses were used. Periodic stimulation functions, however, have several disadvantages:

periodic disturbance processes (e.g. heartbeat, breathing) cannot be separated from the activity signal, and appear as "physiological noise." Processes that show a delay of whole-number multiples of the repetition period likewise cannot be properly recognized. Prolongation of the experiment does not lead to a better suppression of the disturbance in any of these cases.

In addition, periodic stimulation functions have a non-uniform frequency spectrum. Certain spectral components are accordingly excited by the stimulation only weakly or not at all. This introduces a systematic error into the system identification, i.e. the determination of the parameters of a mathematical model.

SUMMARY OF THE INVENTION

An object of the invention is to improve a correlation-based method for functional imaging of brain activity in such a way that the above disadvantages are avoided.

The above objects are achieved in accordance with the principles of the present invention in a method and apparatus for time-resolved and location-resolved representation of functional brain activities of a patient, wherein a stimulation function is generated which is non-periodic, and which has as few secondary maxima as possible in its autocorrelation function, physiological functions of a patient are stimulated with the stimulation function, a magnetic resonance imaging pulse sequence is emitted for exciting nuclear magnetic resonance signals in, and for reading nuclear magnetic resonance signals from, the patient and thereby obtaining time-resolved, and location-resolved nuclear magnetic resonance signals, the nuclear magnetic resonance signals being converted into image data, and wherein location-resolved activity changes in the patient are detected by a chronological correlation of the data with the stimulation function.

The result of the correlation can be displayed as a cross-correlation image.

The stimulation function may be generated using binary codes, or may be in the form of an instruction to the patient for causing the patient to execute instructed actions.

DESCRIPTION OF THE PREFERRED EMBODIMENTS

Figure 1:
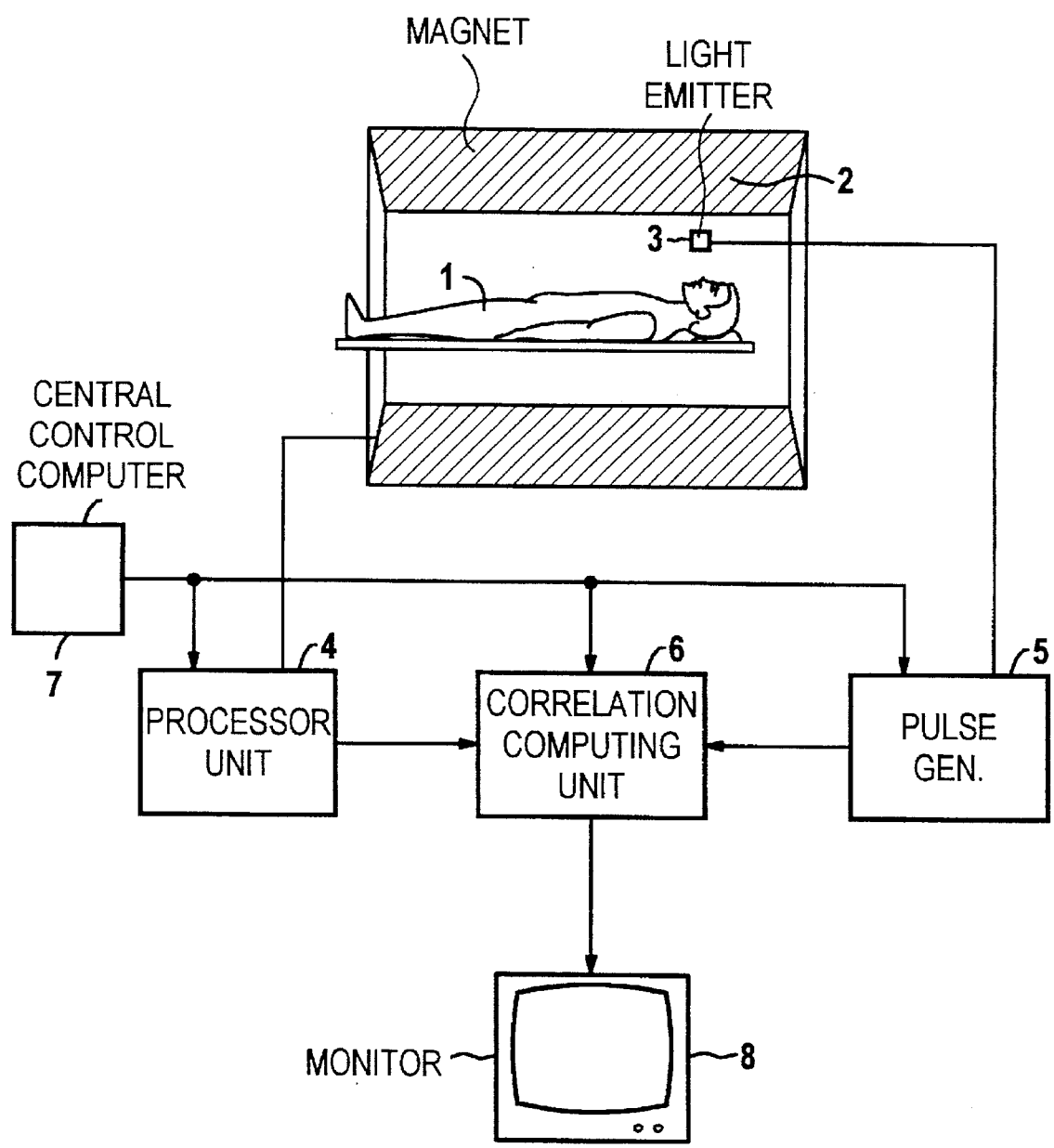
FIG. 1 is a schematic illustration of an MR apparatus for functional imaging constructed an operating in accordance with the principles of the present invention.

As shown in the schematic representation of FIG. 1, a patient 1 is positioned in an apparatus having a magnet 2 that serves for the generation of a basic magnetic field. The apparatus also includes known coil arrangements (not separately shown, for clarity) for the generation of magnetic gradient fields as well as a known radio frequency antenna for transmitting and receiving radio frequency pulses. The gradient coils and the radio frequency antenna are connected to a processor unit 4. The function of the MR apparatus is so far assumed as known, since to this extent the design corresponds to standard equipment.

A stimulation function is generated by a pulse generator 5, by means of which e.g. a light emitter 3 is driven. An electrical stimulation, for example, can alternatively be used, or the patient can (e.g. through optical signals) be caused to carry out movements corresponding to the stimulation function.

The MR data obtained with the processor unit 4 and the stimulation function generated in the pulse generator 5 are correlated with one another in a correlation computing unit 6. The data obtained in this way are displayed on a monitor 8.

The processor unit 4, the correlation computing unit 6 and the pulse generator 5 are controlled by a central control computer 7.

The required MR data must be obtained as rapidly as possible with respect to the time and location resolution. Rapid pulse sequences are thus primarily used. According to current technology, the most rapid MR imaging sequence is what is known as the EPI (echoplanar imaging) sequence, schematically represented in FIGS. 3-7. This sequence represents only an exemplary embodiment; other rapid pulse sequences, such as e.g. turbo spin echo sequences, FISP or FLASH sequences are also possible.

Figure 3:
FIGS. 3–7 show a pulse sequence for conducting the method of the invention.
Figure 4:

In the EPI sequence, a radio frequency pulse RF is first emitted, as shown in FIG. 3. At the same time, a slice selection gradient SS operates according to FIG. 4, so that, in dependence on the frequency spectrum of the radio frequency pulse RF and on the strength of the slice selection gradient SS, only one slice of the subject under examination is excited. A negative partial pulse follows a positive partial pulse of the slice selection gradient SS, the negative pulse canceling the dephasing caused by the positive partial pulse.

Figure 5:
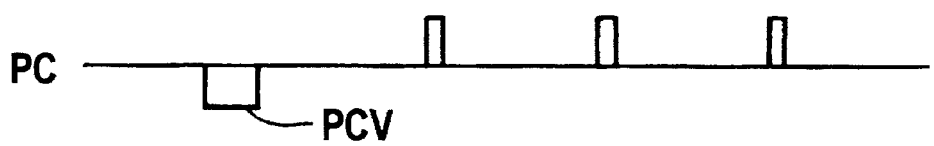
Figure 6:
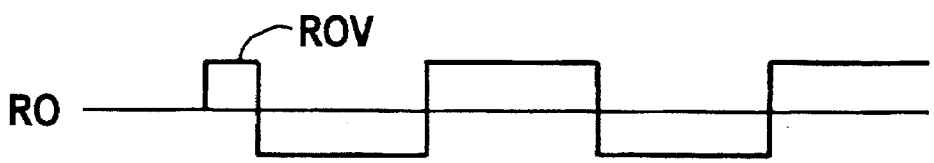
Figure 7:
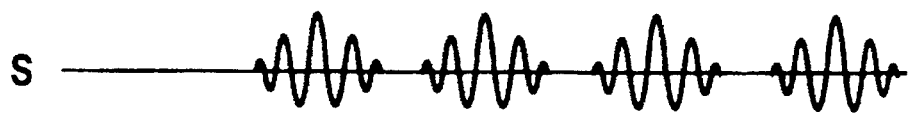

Simultaneous with the negative partial pulse of the slice selection gradient SS, prephasing pulses PCV and ROV are emitted, according to FIGS. 5 and 6, in the phase encoding direction and the readout direction.

The readout gradient RO, with alternating polarity, is subsequently activated. The nuclear magnetic resonance signals are constantly rephased by means of the alternating sign of the readout gradient RO, causing a signal S to arise under each partial pulse of the readout gradient RO.

The signals S are respectively differently phase-encoded, by advancing the phase from signal to signal by means of small phase encoding pulses PC between the signals.

The signals S are demodulated in a phase-sensitive manner and digitized in a grid. The digital values obtained are entered into a row of a raw data matrix per signal. In the most rapid variant of the EPI method, known as the "single-shot EPI," after a single excitation sufficiently many signals S are obtained to create a complete raw data set for an image. The image can be obtained in a known manner through two-dimensional Fourier transformation from the raw data matrix.

For the functional imaging, not only a spatial resolution, but also a time resolution of the signals must ensue. For this purpose, the represented sequence is repeated as rapidly as possible, so that image data allocated to successively different times are obtained.

The smallest element of an image data set is designated as a pixel. In functional imaging, in general one accepts a more coarse resolution than in conventional images, with a typical resolution of 256×256 pixels.

Figure 2:
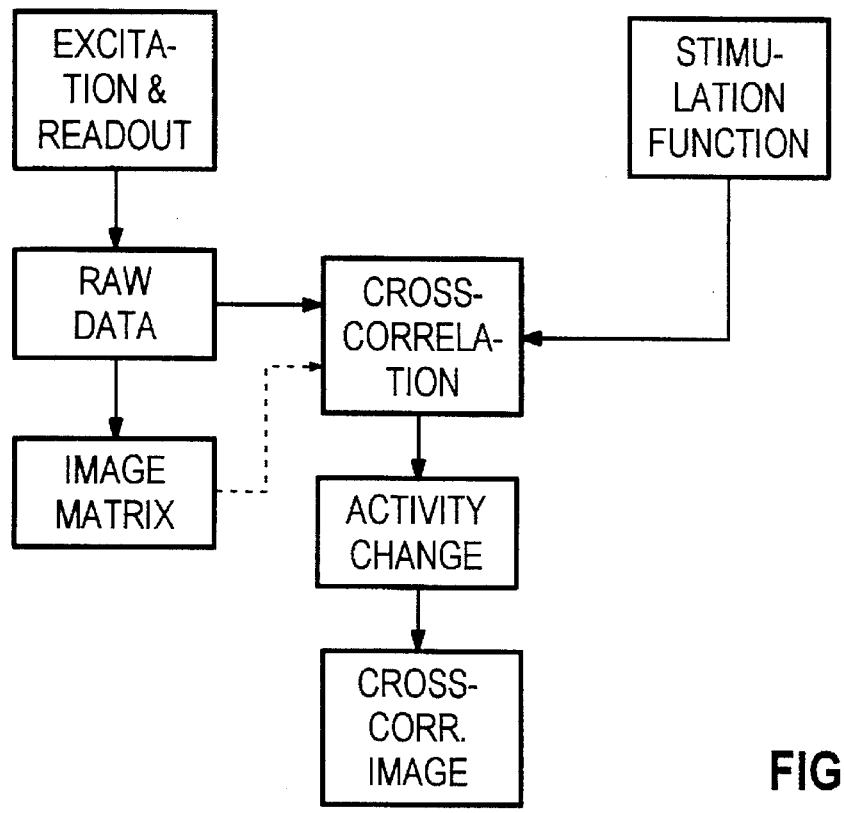
FIG. 2 is a sequence diagram of the method of the invention.

FIG. 2 shows a flow chart of the method. The pulse sequence with excitation and readout of nuclear magnetic resonance Signals and the stimulation function thereby run independently of one another. Both are indeed clocked by means of the central control computer 7, but for example no triggering of the pulse sequence by the stimulation function ensues. Raw data sets are obtained on the basis of the pulse sequences, and image data sets are in turn obtained from these by means of two-dimensional Fourier transformation. For each element in the raw data matrix each pixel in the image data matrix, a chronological signal curve is obtained. A cross-correlation between this signal curve and the stimulation function subsequently ensues.

In order to avoid the disadvantages described above, the stimulation function must not be periodic, and must be optimized with respect to the secondary maxima of the autocorrelation function. Possibilities for this purpose include e.g. binary codes with a sequence of "+1" and "−1" in the form of ±1 S, $a_0, a_1 \ldots a_{N-1}$ and with length N. The autocorrelation function $S_k$ is thereby defined as:

$$S_k = \sum_{i=0}^{N-k-1} a_i a_{i+k}$$

with k=0,1, . . . N−1.

In the article by A. M. Kerdock et al., "Longest Binary Pulse Compression Codes with Given Peak Sidelobe Levels," in: Proceedings of the IEEE, vol. 74, no. 2, February 1986, p. 366, codes of different lengths are indicated that are optimized in the above-described respect. For a code length N=13, a code in hexadecimal form runs for example: 1F35. The minimization of secondary maxima in the autocorrelation function of such codes is synonymous with a flat power spectrum and with an optimal suppression of sources of disturbance, increasing with the length of the function. By means of a cross-correlation of such a stimulation function with the time-dependent function, as taken from the MR data for each pixel, the influences of the stimulation can be extracted from the MR data. Disturbance processes, e.g. due to motion (breathing, heartbeat, pulsing CSF) largely fall away in the cross correlation. The cross-correlation $\psi_{cross}$ of a stimulation function f(t) with the chronological function g(t) obtained from the MR data per pixel is based on the following mathematical relation:

$$\psi_{cross} = \int_{-\infty}^{+\infty} f(t) g(t-r) dt$$

The result of this cross-correlation can be shown on a monitor for each pixel.

Figure 8:
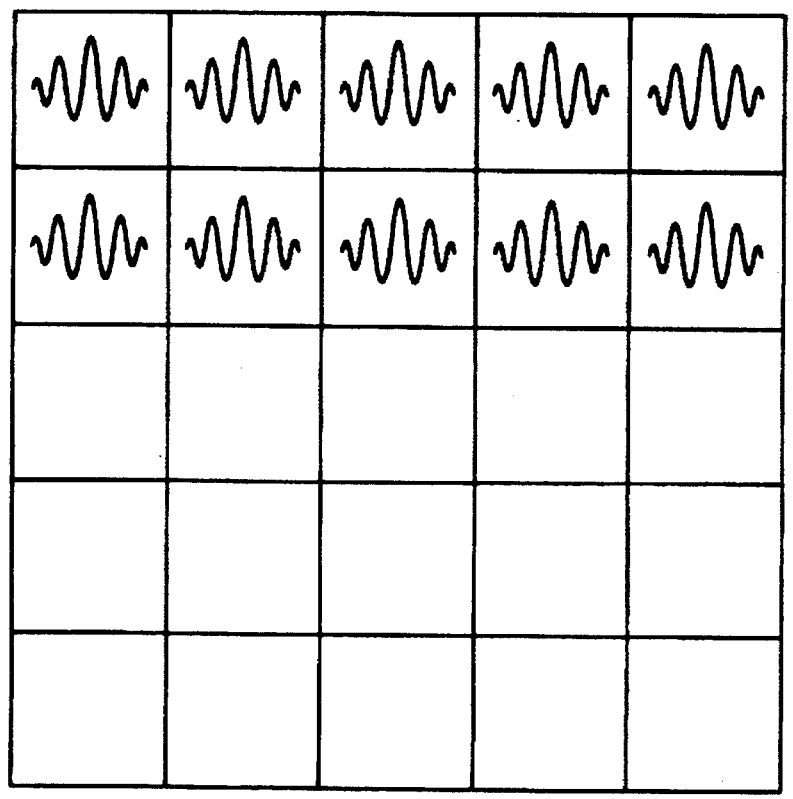
FIG. 8 is a schematic representation of the signal curve in individual pixels which arises in accordance with the invention.

FIG. 8 schematically shows the time sequence of the signal for each pixel. As already explained in connection with FIG. 2, a connection between the stimulation function and the brain activities thereby triggered is created through a correlation analysis. The result of this correlation analysis can then again be shown pixel for pixel on the monitor. Determinate brain regions, i.e. the allocated pixels, can then be selected, and the result of the correlation analysis can be observed for this brain region.

Although modifications and changes may be suggested by those skilled in the art, it is the intention of the inventors to embody within the patent warranted hereon all changes and modifications as reasonably and properly come within the scope of their contribution to the art.

I claim as my invention:

1. A method for time- and location-resolved representation of functional brain activities of a patient by means of magnetic resonance, comprising the steps of:

(a) generating a stimulation function f(t) which is non-periodic, and having a minimized number of secondary maxima in its autocorrelation function;

(b) stimulating physiological functions in a patient with said stimulation function f(t);

(c) emitting a magnetic resonance imaging pulse sequence for the excitation in, and read out of nuclear magnetic resonance signals from, said patient and thereby obtaining time- and location-resolved nuclear magnetic resonance signals, and converting said nuclear magnetic signals into image data; and (d) detecting location-resolved activity changes in the patient by chronological correlation of said data with the stimulation function f(t).

2. A method according to claim 1, further comprising representing a result of the correlation of step (d) as a cross-correlation image.

3. A method according to claim 1, comprising using binary codes as the stimulation function f(t).

4. A method according to claim 1, comprising supplying the stimulation function f(t) to the patient as an instruction for patient actions.

5. An apparatus for time- and location-resolved representation of functional brain activities of a patient by means of magnetic resonance, comprising:

means for generating a stimulation function f(t) which is non-periodic, and having a minimized number of secondary maxima in its autocorrelation function;

means for stimulating physiological functions in a patient with said stimulation function f(t);

means for emitting a magnetic resonance imaging pulse sequence for the excitation in, and read out of nuclear magnetic resonance signals from, said patient and for obtaining time- and location-resolved nuclear magnetic resonance signals, and for converting said nuclear magnetic signals into image data; and means for detecting location-resolved activity changes in the patient by chronological correlation of said data with the stimulation function f(t).

6. An apparatus as claimed in claim 5, further comprising means for representing a correlation result of said means for detecting as a cross-correlation image.

7. An apparatus as claimed in claim 5, wherein said means for generating a stimulation function comprises means for using binary codes as said stimulation function.

* * * * *